US008358536B2

(12) United States Patent  (10) Patent No.: US 8,358,536 B2
Wang  (45) Date of Patent: Jan. 22, 2013

(54) NONVOLATILE MEMORY DEVICE AND METHOD WITH MULTIPLE VERIFICATION PASS VOLTAGES

(75) Inventor: In Soo Wang, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 295 days.

(21) Appl. No.: 12/763,539

(22) Filed: Apr. 20, 2010

(65) Prior Publication Data

US 2010/0302865 A1  Dec. 2, 2010

(30) Foreign Application Priority Data

May 29, 2009 (KR) .......................... 10-2009-0047829

(51) Int. Cl.
G11C 11/34 (2006.01)
G11C 16/04 (2006.01)
(52) U.S. Cl. .......... 365/185.02; 365/185.03; 365/185.22
(58) Field of Classification Search ............. 365/185.02, 365/185.03, 185.22
See application file for complete search history.

(56) References Cited

U.S. PATENT DOCUMENTS 7,369,433 B2 * 5/2008 Toda ........................ 365/185.03
7,433,231 B2 * 10/2008 Aritome ................... 365/185.17
7,440,327 B1 * 10/2008 Sekar et al. .............. 365/185.18
7,688,641 B2 * 3/2010 Noh .......................... 365/185.25
7,839,687 B2 * 11/2010 Dutta et al. ............... 365/185.17

FOREIGN PATENT DOCUMENTS

KR  1020080038924  5/2008

OTHER PUBLICATIONS

Notice of Allowance issued from Korean Intellectual Property Office on Feb. 7, 2011.

* cited by examiner

Primary Examiner — Tuan T Nguyen
Assistant Examiner — Lance Reidlinger
(74) Attorney, Agent, or Firm — IP & T Group LLP

(57) ABSTRACT

A nonvolatile memory device includes an operation voltage generation unit configured to generate a first pass voltage when a verification voltage is higher than a reference voltage and to generate a second pass voltage lower than the first pass voltage when the verification voltage is lower than the reference voltage.

13 Claims, 3 Drawing Sheets

NONVOLATILE MEMORY DEVICE AND METHOD WITH MULTIPLE VERIFICATION PASS VOLTAGES

CROSS-REFERENCE TO RELATED APPLICATION

Priority to Korean patent application number 10-2009-0047529 filed on May 29, 2009, the entire disclosure of which is incorporated by reference herein, is claimed.

BACKGROUND

Exemplary embodiments relate to a nonvolatile memory device and a method of performing a program operation using the same and, more particularly, to a nonvolatile memory device and a method of operating the same, which are capable of preventing an increase in a threshold voltage.

With a gradual increase in the degree of integration of nonvolatile memory devices, a multi-level cell (MLC) capable of storing a number of bits is being used in order to store more data.

FIG. 1 is a cross-sectional view of a nonvolatile memory device for illustrating known concerns. In particular, this figure shows part of the cross section of a memory cell array included in the nonvolatile memory device.

The memory cell array includes a number of strings. Only one of the strings is shown in FIG. 1. The string includes a number of word lines WL0 to WLn, a drain selection line DSL, and a source selection line SSL formed over a semiconductor substrate 10. The word lines WL0 to WLn preferably are formed between the drain selection line DSL and the source selection line SSL. Each of the word lines WL0 to WLn, the drain selection line DSL, and the source selection line SSL is implemented by stacking a gate insulating layer 12, a floating gate 14, a dielectric layer 16, and a control gate 18. In the drain selection line DSL and the source selection line SSL, a hole is formed through a part of the dielectric layer 16, and so the floating gate 14 and the control gate 18 are electrically coupled together. A junction 10a is formed in the semiconductor substrate 10 between the word lines WL0 to WLn, between the drain selection line DSL and the word line WLn, and between the source selection line SSL and the word line WL0. When a driving voltage is supplied to each of the lines, a channel is formed under the lines.

An MLC has a number of threshold voltage ranges. Thus, a difference in the voltage level between a threshold voltage having the lowest level and a threshold voltage having the highest level is increased with an increase in the number of threshold voltage ranges. In particular, with an increase in the level of a threshold voltage, the level of a pass voltage supplied to unselected word lines during a program or read operation also rises. When the level of a pass voltage supplied to the word lines rises, the voltage level of channel boosting generated in the channel regions of unselected strings during a program operation also rises.

Meanwhile, in the case in which there exists a memory cell with a threshold voltage having a high level, channel boosting does not regularly occur, and so the level of channel boosting within the same string may differ. In this case, hot electrons can be generated because an electric field is generated in a region in which the voltage level of channel boosting differs.

FIG. 2 is a graph illustrating an increase in the threshold voltage in a related art.

If hot electrons are introduced into the floating gate of a memory cell, the threshold voltage of the memory cell can shift. For example, if hot electrons are introduced into a memory cell, the threshold voltage can rise from 20 to 22 as shown in FIG. 2. When the threshold voltage rises, the interval between different threshold voltage ranges is narrowed and may deteriorate reliability of the memory cell during a subsequent read operation.

BRIEF SUMMARY

According to some embodiments, when a verification voltage of a memory cell to be programmed is higher than a reference voltage, a first pass voltage is generated. When the verification voltage of the memory cell to be programmed is lower than the reference voltage, a second pass voltage lower than the first pass voltage is generated. Accordingly, the level of channel boosting can be controlled during a program verification operation.

A nonvolatile memory device according to an aspect of the present disclosure comprises a memory cell array comprising memory cells, an operation voltage generation unit configured to generate a first pass voltage when a verification voltage for a memory cell to be programmed, from among the memory cells, is higher than a reference voltage and to generate a second pass voltage lower than the first pass voltage when the verification voltage for the memory cell to be programmed is lower than the reference voltage, a high voltage switch unit configured to transfer the first or second pass voltage to global word lines other than a selected global word line and to transfer the verification voltage to the selected global word line of the global word lines, and a block selection unit coupled between the global word lines and word lines and configured to transfer the verification voltage and the first or second pass voltage to the word lines.

A method of performing a program operation using a nonvolatile memory device according to another aspect of the present disclosure comprises, when a verification voltage of a selected memory cell coupled to a selected word line is higher than a reference voltage, supplying a first pass voltage to a number of word lines other than the selected word line or, when the verification voltage of the selected memory cell is lower than the reference voltage, supplying a second pass voltage lower than the first pass voltage to a number of the word lines including the selected word line, and supplying a verification voltage to the selected word line.

A method of performing a program operation using a nonvolatile memory device according to yet another aspect of the present disclosure comprises, during a verification operation, supplying a first pass voltage to a number of word lines other than a selected word line, when a verification voltage of a selected memory cell coupled to the selected word line is lower than a first reference voltage, supplying a second pass voltage higher than the first pass voltage to a number of the word lines other than the selected word line when the verification voltage is higher than the first reference voltage but lower than a second reference voltage, and supplying a third pass voltage higher than the second pass voltage to a number of the word lines other than the selected word line when the verification voltage is higher than the second reference voltage, and supplying a verification voltage to the selected word line.

DESCRIPTION OF EMBODIMENTS

Hereinafter, one or more embodiments of the present disclosure will be described in detail with reference to the accompanying drawings. The figures are provided to allow those having ordinary skill in the art to understand the scope of the embodiments of the disclosure.

Figure 1:
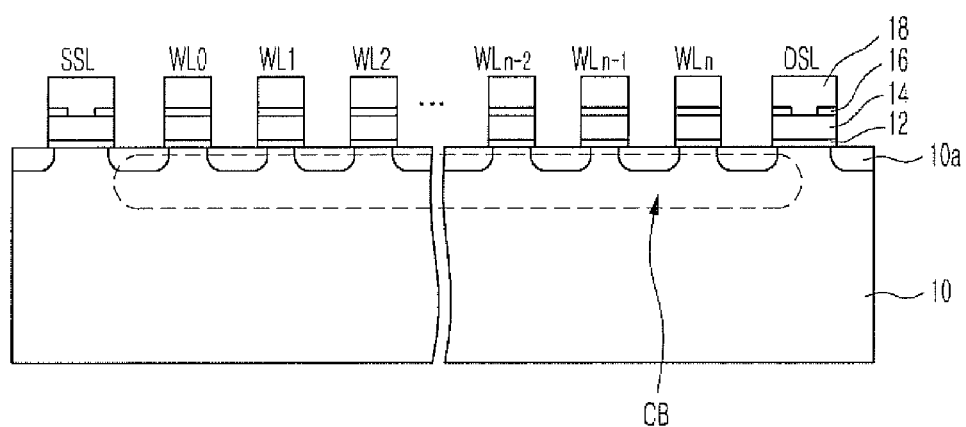
FIG. 1 is a cross-sectional view of a nonvolatile memory device for illustrating related concerns.
Figure 2:
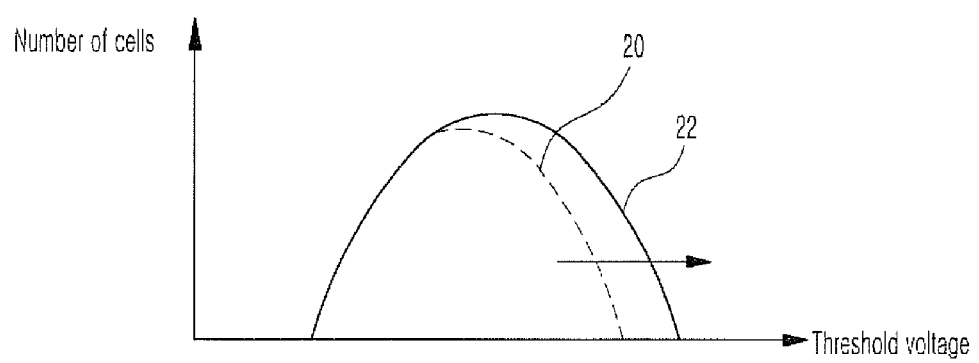
FIG. 2 is a graph illustrating an increase in the threshold voltage in a related art.
Figure 3:
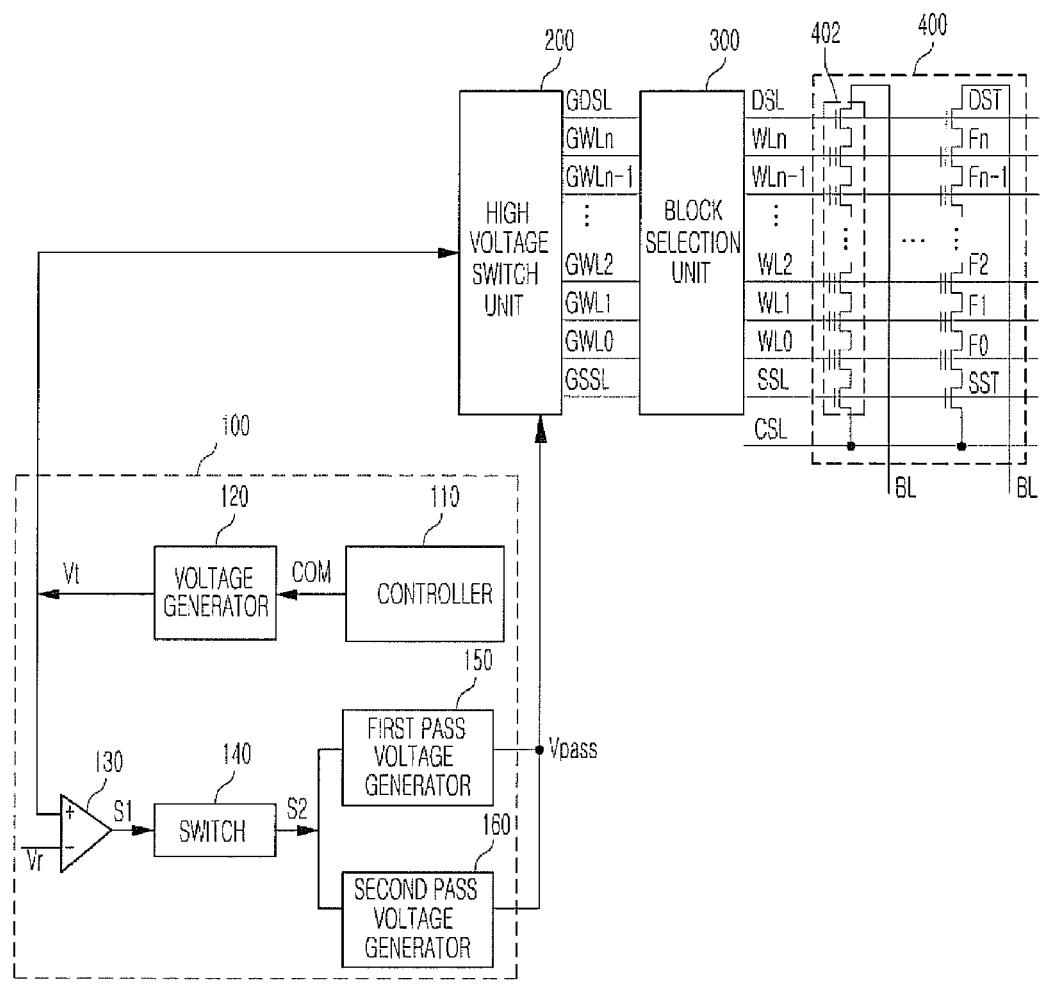
FIG. 3 is a block diagram of a nonvolatile memory device according to an exemplary embodiment of the present disclosure.

FIG. 3 is a block diagram of a nonvolatile memory device according to an exemplary embodiment of the present disclosure.

The nonvolatile memory device includes an operation voltage generation unit 100, a high voltage switch unit 200, a block selection unit 300, and a memory cell array 400.

The operation voltage generation unit 100 is configured to generate a first pass voltage supplied through a pass line Vpass when the verification voltage Vt of a memory cell to be programmed is higher than a reference voltage Vr and to generate a second pass voltage lower than the first pass voltage when the verification voltage Vt of a memory cell to be programmed is lower than the reference voltage Vr.

The operation voltage generation unit 100 includes a controller 110, a voltage generator 120, a comparator 130, a switch 140, and first and second pass voltage generators 150 and 160.

The voltage generator 120 is configured to generate a program voltage or the verification voltage Vt in response to a program operation command signal COM generated by the controller 110. The verification voltage Vt becomes a program verification voltage of a selected memory cell.

The comparator 130 is configured to compare the reference voltage Vr and the verification voltage Vt and to generate a first signal S1. For example, when the verification voltage Vt is higher than the reference voltage Vr, the comparator 130 generates the first signal S1 of a logic high level. When the verification voltage Vt is lower than the reference voltage Vr, the comparator 130 generates the first signal S1 of a logic low level. Here, the reference voltage Vr can be set on the basis of any one of a number of program threshold voltage ranges. For example, the lowest threshold voltage from among a distribution of the threshold voltages in a threshold voltage range (i.e., a reference) can be set as the reference voltage Vr. According to an exemplary embodiment, the reference threshold voltage range can be set on the basis of an average threshold voltage range from among a number of threshold voltage ranges. This is described more specifically later with FIG. 4.

Figure 4:
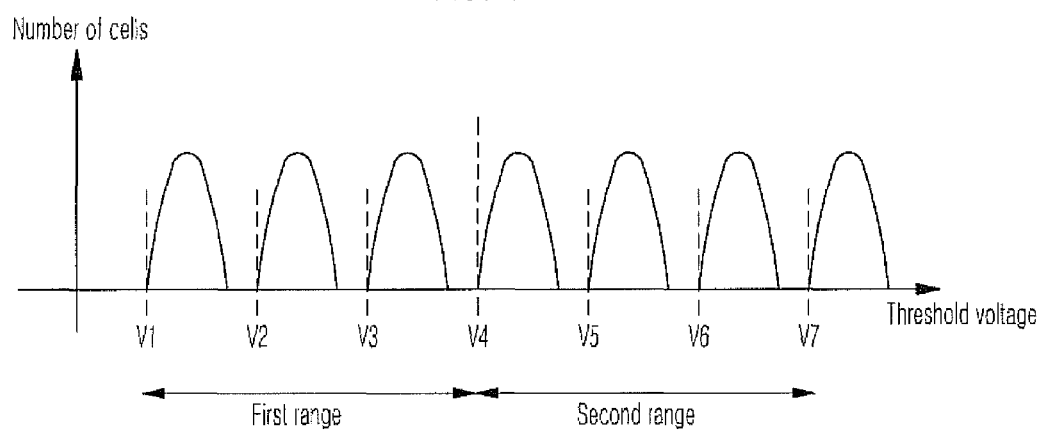
FIG. 4 is a graph illustrating a program operation according to an exemplary embodiment of the present disclosure.

FIG. 4 is a graph illustrating a program operation according to an exemplary embodiment of the present disclosure.

A nonvolatile memory device having seven program threshold voltage ranges is described as an example. The seven program threshold voltage ranges do not overlap with each other. It is assumed that a range having the lowest voltage level is called a first threshold voltage range and a range having the highest voltage level is called a seventh threshold voltage range. During a program operation, a verification operation is performed. Verification voltages differ in the seven program threshold voltage ranges. For example, a verification voltage in the first threshold voltage range can be a first verification voltage V1, and a verification voltage in the seventh threshold voltage range can be a seventh verification voltage V7. The reference voltage Vr described with reference to FIG. 3 is one of the first to seventh verification voltages V1 to V7. A case in which the fourth verification voltage V4 of the first to seventh verification voltages is set as the reference voltage Vr is described as an example. According to an example, a range of the threshold voltage ranges having a voltage level lower than the fourth verification voltage V4 is called a first range, and a range of the threshold voltage ranges having a voltage level higher than the fourth verification voltage V4, is called a second range.

Referring to FIG. 3, the switch 140 is configured to generate a second signal S2 in response to the first signal S1. For example, when the first signal S1 is in a logic high level, the switch 140 generates the second signal S2 of a logic high level. When the first signal S1 is in a logic low level, the switch 140 generates the second signal S2 of a logic low level.

The first pass voltage generator 150 is enabled in response to the second signal S2 of a logic high level and is configured to generate the first pass voltage supplied through the pass line Vpass.

The second pass voltage generator 160 is enabled in response to the second signal S2 of a logic low level and is configured to generate the second pass voltage lower than the first pass voltage supplied through the pass line Vpass. The second pass voltage according to an example has a voltage level which is equal to or lower than ½ of the first pass voltage.

The high voltage switch unit 200 is configured to transfer signals, generated by the first or second pass voltage generator 150 or 160 and the voltage generator 120, to global word lines GWL0 to GWLn. More specifically, the high voltage switch unit 200 is coupled to the block selection unit 300 via a global drain selection line GDSL, the global word lines GWL0 to GWLn, and a global source selection line GSSL. In particular, the high voltage switch unit 200 is configured to transfer a program voltage or a verification voltage Vt, which is generated by the voltage generator 120, to a global word line selected from the global word lines GWL0 to GWLn. Furthermore, the high voltage switch unit 200 transfers the first or second pass voltage, generated by the first or second pass voltage generator 150 or 160, to the remaining unselected global word lines. Here, the selected global word line is coupled to a memory cell to be programmed, and the remaining unselected global word lines are coupled to the remaining memory cells other than the memory cell to be programmed. Furthermore, the high voltage switch unit 200 is configured to transfer a driving voltage, outputted from a driving voltage generator (not shown), to the global drain selection line GDSL and the global source selection line GSSL.

The block selection unit 300 is coupled between the global word lines GWL0 to GWLn, the global drain selection line GDSL, and the global source selection line GSSL, and word lines WL0 to WLn, a drain selection line DSL, and a source selection line SSL. In the case in which one memory cell block (e.g., the memory cell block 400) is selected from among a number of memory cell blocks, the block selection unit 300 coupled to the corresponding memory cell block 400 is enabled. When the block selection unit 300 is enabled, voltages supplied to the global word lines GWL0 to GWLn, the global drain selection line GDSL, and the global source selection line GSSL are respectively transferred to the word lines WL0 to WLn, the drain selection line DSL, and the source selection line SSL.

The memory cell block 400 includes a number of strings. One (e.g., a string 402) of the strings is described below. The string 402 includes a number of memory cells F0 to Fn configured to store data, a drain select transistor DST configured to electrically couple a bit line BL and the active region of the string 402, and a source select transistor SST configured to electrically couple a common source line CSL and the active region of the string 402.

During a program operation, a ground voltage (e.g., 0 V) is supplied through the bit line BL coupled to a selected string (e.g., the string 402), and a power source voltage (e.g., Vdd) is supplied through the bit lines BL coupled to the remaining unselected strings.

A program operation using the nonvolatile memory device is described below with reference to FIGS. 3 and 4.

When a program operation starts, the controller 110 generates the program operation command signal COM. The voltage generator 120 generates a verification voltage Vt for a memory cell to be programmed in response to the program operation command signal COM. When the verification voltage Vt is generated, the comparator 130 compares the reference voltage Vr and the verification voltage Vt and generates the first signal S1 according to a result of the comparison. For example, when the verification voltage Vt is higher than the reference voltage Vr, the comparator 130 generates the first signal S1 of a logic high level. When the verification voltage Vt is lower than the reference voltage Vr, the comparator 130 generates the first signal S1 of a logic low level. The switch 140 generates the second signal S2 (i.e., an active voltage of the first or second pass voltage generator 150 or 160) in response to the first signal S1. For example, when the first signal S1 of a logic high level is received, the switch 140 generates the second signal S2 of a logic high level, thereby enabling the first pass voltage generator 150. When the first signal S1 of a logic low level is received, the switch 140 generates the second signal S2 of a logic low level, thereby enabling the second pass voltage generator 160.

The first pass voltage generator 150 is enabled to generate the first pass voltage supplied through the pass line Vpass. The second pass voltage generator 160 is enabled to generate the second pass voltage lower than the first pass voltage through the pass line Vpass. As described above, if the level of the pass voltage is controlled in response to the level of the verification voltage Vt, the level of channel boosting of the remaining strings other than the selected string 402 including the memory cell to be programmed can be controlled.

During a verification operation, the high voltage switch unit 200 transfers the verification voltage Vt, generated by the voltage generator 120, to a selected global word line and transfers the first or second pass voltage to the remaining unselected global word lines. More specifically, the high voltage switch unit 200 transfers the first or second pass voltage to all the global word lines GWL0 to GWLn other than a selected global word line and then transfers the verification voltage Vt to the selected global word line. The block selection unit 300 transfers the first or second pass voltage and the verification voltage Vt to the word lines WL0 to WLn of the selected memory cell block 400.

The ground voltage (e.g., 0 V) is supplied to the bit line BL coupled to the selected string 402 from among the strings included in the memory cell block 400, and the power source voltage Vdd is supplied to the bit lines BL coupled to the remaining unselected strings other than the selected string 402.

In particular, since the verification voltage Vt is supplied to a selected word line and the first or second pass voltage is supplied to the remaining unselected word lines, a channel boosting phenomenon can occur in the channel region of the remaining unselected strings.

Figure 5:
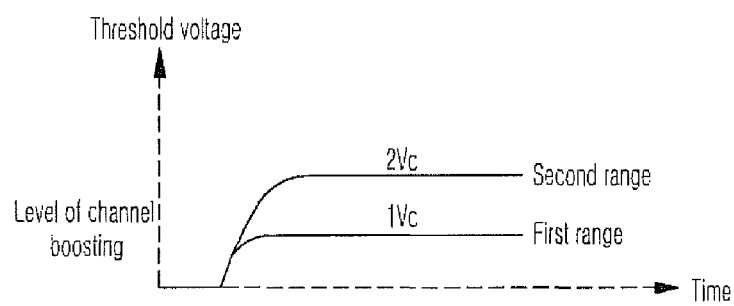
FIG. 5 is a graph illustrating the level of channel boosting according to the program operation according to an exemplary embodiment of the present disclosure.

At this time, when the verification voltage Vt for the selected memory cell is higher than the fourth verification voltage V4, the first pass voltage is transferred to the remaining unselected word lines. When the verification voltage Vt is lower than the fourth verification voltage V4, the second pass voltage is transferred to the remaining unselected word lines. That is, if the level of the verification voltage Vt is high (refer to the second range of FIG. 4), the level of the pass voltage is raised in order to raise the level of channel boosting (refer to 2Vc of FIG. 5). If the level of the verification voltage Vt is low (refer to the first range of FIG. 4), the level of the pass voltage is lowered in order to lower the level of channel boosting (refer to 1Vc of FIG. 5). Here, the threshold voltage ranges, as shown in FIG. 4, can be classified into the first and second ranges. In some embodiments, the threshold voltage ranges may be classified into two or more ranges, where appropriate pass voltages can be supplied depending on which range that the level of the verification voltage Vt belongs. For example, during a verification operation, a first pass voltage can be supplied to a number of word lines other than a selected word line, when a verification voltage of a selected memory cell coupled to the selected word line is lower than a first reference voltage, a second pass voltage higher than the first pass voltage can be supplied to a number of the word lines other the selected word line when the verification voltage is higher than the first reference voltage but lower than a second reference voltage, and a third pass voltage higher than the second pass voltage can be supplied to a number of the word lines other than the selected word line when the verification voltage is higher than the second reference voltage. As described above, the level of a pass voltage is controlled in response to a change in the level of a verification voltage. Accordingly, a phenomenon where an electric field differs can be prevented/minimized, occurrences of hot electrons can be prevented/reduced, and a reduction in the reliability of a programmed memory cell can be prevented/minimized.

Figure 6:
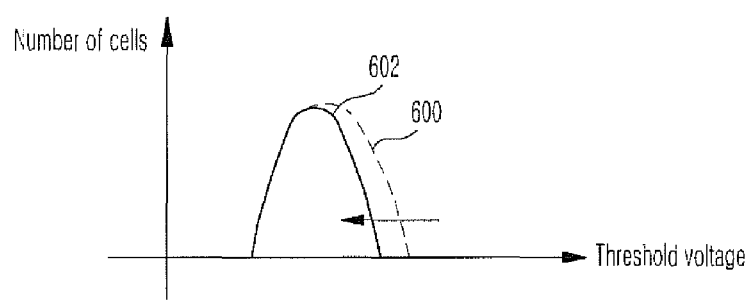
FIG. 6 is a graph illustrating the threshold voltages according to an exemplary embodiment of the present disclosure.

FIG. 6 is a graph illustrating the threshold voltages according to an exemplary embodiment of the present disclosure.

As described above, the level of a pass voltage is controlled in response to the level of a program voltage. Accordingly, when channel boosting occurs, the level of the channel boosting can be controlled. Consequently, since occurrences of hot electrons can be prevented/reduced, an increase of the threshold voltage of a memory cell (refer to 600 to 602 in FIG. 6) can be prevented/reduced.

According to the present disclosure, when a verification voltage of a memory cell to be programmed is higher than a reference voltage, a first pass voltage is generated. When the verification voltage of the memory cell to be programmed is lower than the reference voltage, a second pass voltage lower than the first pass voltage is generated. Accordingly, since the level of channel boosting occurring in unselected strings during a program verification operation can be controlled, occurrences of hot electrons can be prevented/reduced, and a shift in the threshold voltage of a memory cell can be prevented/reduced. Consequently, the reliability of a nonvolatile memory device can be improved.

What is claimed is:

1. A nonvolatile memory device, comprising:
   a memory cell array comprising memory cells;
   an operation voltage generation unit configured to generate a first pass voltage when a verification voltage for a memory cell to be programmed, from among the memory cells, is higher than a reference voltage and to generate a second pass voltage lower than the first pass voltage when the verification voltage for the memory cell to be programmed is lower than the reference voltage;

a high voltage switch unit configured to transfer the first or second pass voltage to global word lines other than a selected global word line and to transfer the verification voltage to the selected global word line of the global word lines; and a block selection unit coupled between the global word lines and word lines and configured to transfer the verification voltage and the first or second pass voltage to the word lines.

2. The nonvolatile memory device of claim 1, wherein the operation voltage generation unit comprises:

a controller configured to generate an operation command signal;

a voltage generator configured to generate the verification voltage in response to the operation command signal;

a comparator configured to compare the verification voltage and the reference voltage and to generate a first signal;

a switch configured to generate a second signal in response to the first signal; and first and second pass voltage generators controlled in response to the second signal.

3. The nonvolatile memory device of claim 2, wherein the verification voltage has a same voltage level as a program verification voltage of the memory cell to be programmed.

4. The nonvolatile memory device of claim 2, wherein the comparator is configured to generate the first signal of a logic low level when the verification voltage is lower than the reference voltage and to generate the first signal of a logic high level when the verification voltage is higher than the reference voltage.

5. The nonvolatile memory device of claim 2, wherein the switch is configured to generate the second signal of a logic low level in response to the first signal of a logic low level and generate the second signal of a logic high level in response to the first signal of a logic high level.

6. The nonvolatile memory device of claim 5, wherein:

when the second signal is in a logic low level, the second pass voltage generator is configured to be enabled, and when the second signal is in a logic high level, the first pass voltage generator is configured to be enabled.

7. The nonvolatile memory device of claim 6, wherein:

when the first pass voltage generator is enabled, the first pass voltage generator is configured to generate the first pass voltage, and when the second pass voltage generator is enabled, the second pass voltage generator is configured to generate the second pass voltage having a level lower than that of the first pass voltage.

8. The nonvolatile memory device of claim 7, wherein the level of the second pass voltage is half of the level of the first pass voltage.

9. A method of performing a program operation using a nonvolatile memory device, the method comprising:

comparing a verification voltage with a reference voltage:

supplying the verification voltage to a selected word line;

supplying a first pass voltage to remaining unselected word lines when the verification voltage is determined to be higher than the reference voltage in response to the comparison; and supplying a second pass voltage lower than the first pass voltage to the remaining unselected word lines when the verification voltage is determined to be lower than the reference voltage in response to the comparison.

10. The method of claim 9, wherein the reference voltage has a same voltage level as the verification voltage in one of a number of threshold voltage ranges which are in a program state.

11. The method of claim 9, further comprising supplying the second pass voltage to the selected word line when the verification voltage has a same voltage level as the reference voltage.

12. A method of performing a program operation using a nonvolatile memory device, the method comprising:

comparing a verification voltage with a first reference voltage and a second reference voltage higher than the first reference voltage, respectively, wherein the verification voltage is supplied to a selected memory cell coupled to a selected word line;

supplying the verification voltage to the selected word line;

supplying a first pass voltage to remaining unselected word lines when the verification voltage is determined to be lower than the first reference voltage in response to the comparison;

supplying a second pass voltage higher than the first pass voltage to the remaining unselected word lines when the verification voltage is determined to be higher than the first reference voltage but lower than the second reference voltage in response to the comparison; and supplying a third pass voltage higher than the second pass voltage to the remaining unselected word lines when the verification voltage is determined to be hither than the second reference voltage in response to the comparison.

13. The method of claim 12, further comprising supplying a ground voltage to a bit line coupled to a selected string including the selected memory cell and supplying a power source voltage to bit lines coupled to remaining unselected strings other than the selected string.

* * * * *